(12) United States Patent
Ogura (10) Patent No.: US 7,221,226 B2
(45) Date of Patent: May 22, 2007

(54) AMPLIFYING APPARATUS WITH AUTOMATIC LEVEL CONTROLLER

(75) Inventor: Akio Ogura, Kyoto (JP)

(73) Assignee: Rohm Co., Ltd. (JP)

( * ) Notice: Subject to any disclaimer, the term of this patent is extended or adjusted under 35 U.S.C. 154(b) by 64 days.

(21) Appl. No.: 11/152,963

(22) Filed: Jun. 15, 2005

(65) Prior Publication Data

US 2005/0280470 A1    Dec. 22, 2005

(30) Foreign Application Priority Data

Jun. 17, 2004   (JP)  ............................. 2004-179588
May 9, 2005   (JP)  ............................. 2005-135729

(51) Int. Cl.
     *H03G 3/10*      (2006.01)

(52) U.S. Cl. ........................ 330/281; 330/75; 330/278

(58) Field of Classification Search ................ 330/281, 330/75, 278, 291
See application file for complete search history.

(56) References Cited

U.S. PATENT DOCUMENTS 4,134,079 A * 1/1979 Kohtani ...................... 330/281
5,771,301 A * 6/1998 Fuller et al. ................. 381/107
6,418,303 B1 * 7/2002 Blackburn et al. ........ 455/234.2
6,628,795 B1 * 9/2003 Ludvigsen ................... 381/321
7,065,335 B2 * 6/2006 Ben-Ayun et al. ........ 455/240.1
2006/0017501 A1 * 1/2006 Nodake ....................... 330/141

FOREIGN PATENT DOCUMENTS

JP      2003-173211      6/2003

* cited by examiner

*Primary Examiner*—Patricia Nguyen
(74) *Attorney, Agent, or Firm*—Cantor Colburn LLP (57) ABSTRACT

A window comparator compares a level of an output signal with an attack reference level, and outputs an attack signal based upon an attack reference comparison result signal thus obtained, and compares the output signal level with a recovery reference level, and outputs a recovery signal based upon a recovery reference comparison result signal thus obtained. An attack timing signal generating unit outputs an attack timing signal at first predetermined time intervals. A recovery timing signal generating unit outputs a recovery timing signal at second time intervals which are longer than the first predetermined time interval. An action determining circuit generates a gain reduction signal and a gain increase signal. The amplification gain of the variable gain amplifier is reduced or increased based upon the gain reduction signal or the gain increase signal.

20 Claims, 7 Drawing Sheets

| ATTACK SIGNAL Satth | L | L | H |
|---|---|---|---|
| RECOVERY SIGNAL Srech | L | H | H |
| STATE OF GAIN CONTROL | RECOVERY | STEADY | ATTACK |

AMPLIFYING APPARATUS WITH AUTOMATIC LEVEL CONTROLLER

BACKGROUND OF THE INVENTION

1. Field of the Invention

The present invention relates to an amplifying apparatus (which will also be referred to as "amplifier" hereafter) with an automatic level controller (which will be referred to as "ALC" hereafter) for controlling the output level of an amplifier by controlling the gain of a variable gain amplifier included therein.

2. Description of the Related Art

Conventional automatic level controllers are well known, having a function for controlling the gain of a variable gain amplifier so as to output a constant-level output signal. These automatic level controllers work as follows. That is to say, the output signal level is compared with a reference level. In a case that the output signal level is higher than the reference level, the automatic level controller reduces the gain thereof. On the other hand, in a case that the output signal level is lower than the reference level, the automatic level controller increases the gain thereof. Such increase and reduction are performed at predetermined time intervals (frame period), thereby enabling stable gain control (see Patent document 1).

[Patent Document 1]
Japanese Patent Application Laid-open No. 2003-173211

With conventional automatic level controllers, the gain of an amplifier is adjusted in response to fluctuation of the output-signal level around a reference level. Data communication circuits and so forth operate without any problems as long as the signal level is maintained, regardless of how frequent the amplifier gain is adjusted. Accordingly, with the conventional automatic level controllers, the frame period is designed so as to prevent error due to noise or the like. Thus, the frame period is preferably set to as short a period as possible.

However, an amplifier with an ALC for automatic control of the output signal level of audio signals so as to be within a predetermined level has different problems. That is to say, with an arrangement in which the gain is controlled exactly in response to fluctuation of the output signal level around the reference level, the output signal level changes exactly in response to the change in gain, leading to a problem of unnatural-sounding audio signals from the perspective of auditory sensation.

Furthermore, an arrangement in which action for increasing the amplification gain (i.e., recovery action) and action for reducing the amplification gain (e.g., attack action) are performed at the same intervals (frame period) also has a problem of output of unnatural-sounding audio signals from the perspective of auditory sensation.

For example, let us consider a case of the attack action. In this case, with an arrangement in which gain control is performed at excessively long intervals, an audio signal input suddenly after a period of no audio signals is amplified with an excessively high gain, leading to a problem of an excessively high output-signal level. Furthermore, this leads to distortion of the output-signal waveform, and such distortion remains for a while. Thus, in a case of the attack action, the gain control is preferably performed with short intervals from the perspective of auditory sensation.

Next, let us consider a case of the recovery action. In this case, with an arrangement in which gain control is performed at excessively short intervals, gain is increased immediately in response to a stop of audio signals. This leads to amplification of noise, resulting in a problem of audio signals with extremely poor quality from the perspective of auditory sensation. Furthermore, in a case of the recovery action, with an arrangement in which gain control is performed at excessively long intervals, a small audio signal suddenly input after a period of large signals leads to a problem that such a small audio signal is amplifies with an excessively low amplification gain for a while, resulting in a situation in which such a small audio signal cannot be heard for a while. Thus, control of the recovery action is preferably performed with suitably-long intervals from the perspective of natural-sounding auditory sensation.

SUMMARY OF THE INVENTION

The present invention has been made in view of the above problems, and accordingly, it is an object thereof to provide an amplifier with an ALC suitable for mobile electronic devices having audio input/output functions such as cellular phones and so forth, which operates suitably in both the attack mode and the recovery mode from the perspective of natural-sounding auditory sensation while suppressing frequent switching between the attack mode and the recovery mode.

Also, it is another object of the present invention to provide an amplifier which allows dynamic adjustment of the amplification factor and conditions of the attack action and the recovery action corresponding to the distance between the electronic device including the amplifier and the user or listener, thereby providing natural-sounding auditory sensation.

An aspect of the present invention relates to an amplifier circuit including a variable gain amplifier having a function of adjustment of an amplification gain according to a gain control signal for amplifying an input signal with the gain thus adjusted, thereby outputting an output signal within a predetermined level. The amplifier circuit comprising: a window comparator which compares a level of the output signal (which will be referred to as "output signal level" hereafter) with an attack reference level, and outputs an attack signal based upon an attack reference comparison result signal thus obtained, and which compares the output signal level with a recovery reference level different from the attack reference level, and outputs a recovery signal based upon a recovery reference comparison result signal thus obtained; an attack timing signal generating unit for outputting an attack timing signal at first predetermined time intervals; a recovery timing signal generating unit for outputting a recovery timing signal at second time intervals which are longer than the first predetermined time interval; and an action determining circuit which generates a gain reduction signal for decrementing the amplification gain by a first predetermined gain each time the attack timing signal is generated during output of the attack signal, and generating a gain increase signal for incrementing the amplification gain by a second predetermined gain each time the recovery timing signal is generated during output of the recovery signal. With such a configuration, the amplification gain of the variable gain amplifier is reduced or increased based upon the gain reduction signal or the gain increase signal while maintaining the amplification gain in a case that neither the gain reduction signal nor the gain increase signal is output.

As described above, such an arrangement includes the window comparator, thereby allowing the gain control mechanism to enter the state where neither the attack action for reducing the amplification gain nor the recovery action for increasing the amplification gain is not performed, i.e., the state where the gain is maintained. This suppresses frequent change in the amplification gain, thereby suppressing unnatural-sounding audio signals from the perspective of auditory sensation.

Furthermore, with such an arrangement, the recovery timing signal Tr is generated at the second time interval which is longer than the first time interval at which the attack timing signal Ta is generated. Accordingly, the attack action for reducing the amplification gain is performed with a higher frequency than with the recovery action for increasing the amplification gain. This enables output of natural-sounding audio signals from the perspective of auditory sensation in both the attack mode and the recovery mode.

An arrangement may be made in which the attack reference comparison result signal is held, and the signal thus held is used as the attack signal. Furthermore, an arrangement may be made in which the attack signal is reset according to an attack reset signal output at the same time as with the attack timing signal. Furthermore, an arrangement may be made in which the recovery reference comparison result signal is held, and the signal thus held is used as the recovery signal. Furthermore, an arrangement may be made in which the recovery signal is reset according to a recovery reset signal output at the same time as with the recovery timing signal.

An arrangement may be made in which in the event that the output signal level is within a range between: a first recovery reference level which is higher than an output signal center level by a first predetermined voltage; and a second recovery reference level which is lower than the output signal center level by the first predetermined voltage, the recovery reference comparison result signal is output. Furthermore, an arrangement may be made in which in the event that the output signal level is greater than a first attack reference level which is higher than the first recovery reference level by a second predetermined voltage, or is smaller than a second attack reference level which is lower than the second recovery reference level by the second predetermined voltage, the attack reference comparison result signal is output.

Such an amplifier circuit may have functions of adjustment of each of: the first predetermined time interval used in the attack timing generating unit; and the second predetermined time interval used in the recovery timing signal generating unit, according to setting values supplied from external circuits.

Such an amplifier circuit may further include a setting circuit for rewritably storing setting values which are supplied from external circuits and used as the first predetermined time interval and the second predetermined time interval. With such an arrangement, the first predetermined time interval and the second predetermined time interval may be set in the attack timing signal generating unit and the recovery timing signal generating unit, respectively, based upon the setting values stored in the setting circuit.

Such an arrangement allows individual adjustment of the first and second predetermined time intervals at a desirable time according to the setting values stored in the setting circuit. This enables dynamic adjustment of audio signals from the perspective of auditory sensation even in actual use of the amplifier circuit.

An arrangement may be made in which the attack timing signal generating unit and the recovery timing signal generating unit are counter circuits for counting a clock signal supplied from external circuits, thereby counting the first and second predetermined time intervals.

An arrangement may be made in which the variable gain amplifier is of a switched-resistor amplifier type having a function of adjustment of the gain by switching resistance of a resistor included therein. With such an arrangement, gain control is performed by switching the resistance between multiple values by actions of a set of switches.

With such an arrangement, employed as the aforementioned variable gain amplifier is of a stitched-resistor variable gain amplifier type having a function for switching the resistance of the input resistor or the resistance of the feedback resistor between multiple resistance values, thereby enabling analog linear control. This enables improved distortion properties.

Such an amplifier circuit may further include a decoder which generates the gain control signal based upon the gain reduction signal and the gain increase signal, and which supplies the gain control signal to the variable gain amplifier. With such an arrangement, a maximum value and a minimum value of the gain control signal output from the decoder may adjustably be set based upon setting values supplied from external circuits.

Such an arrangement allows adjustment of the maximum value and the minimum value of the gain control signal at a desirable time based upon the actual state of use such as the distance between an cellular phone including the amplifier circuit and the user or listener.

Such an amplifier circuit may further include a setting circuit for rewritably storing setting values which are supplied from external circuits, and used as the maximum value and the minimum value of the gain control signal. With such an arrangement, the maximum value and the minimum value of the gain control signal may be set in the decoder based upon the setting values stored in the setting circuit.

Another aspect of the present invention relates to an electronic device. The electronic device comprises: an audio output unit; and the aforementioned amplifier circuit for outputting an analog audio signal to the audio output unit.

Examples of the audio output units include a speaker, a headphone, an earphone, and so forth. Such an arrangement suppresses unnatural-sounding audio signals output from the audio output unit from the perspective of auditory sensation.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
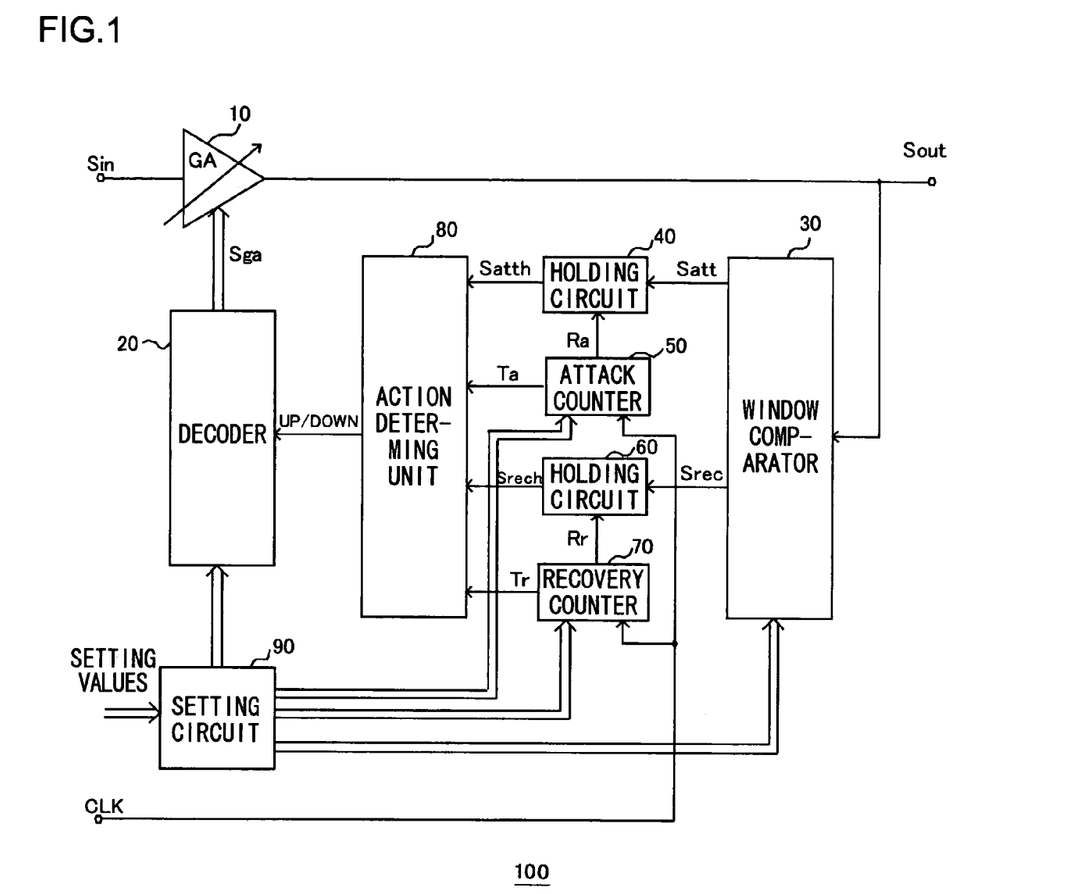
FIG. 1 is a diagram which shows a configuration of an amplifier according to an embodiment of the present invention.
Figure 2:
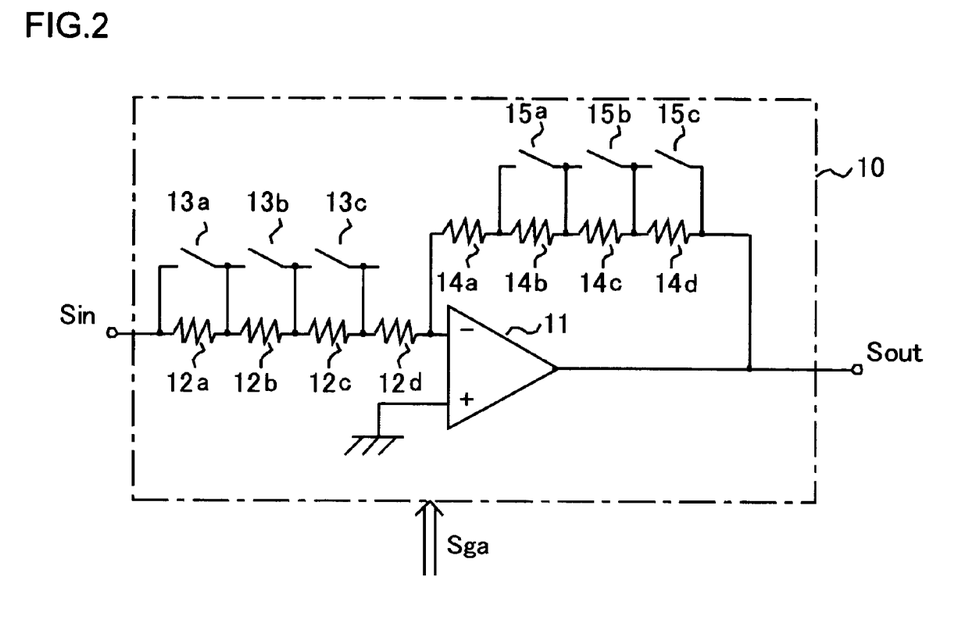
FIG. 2 is a diagram which shows a configuration example of a variable gain amplifier shown in FIG. 1.
Figure 3:
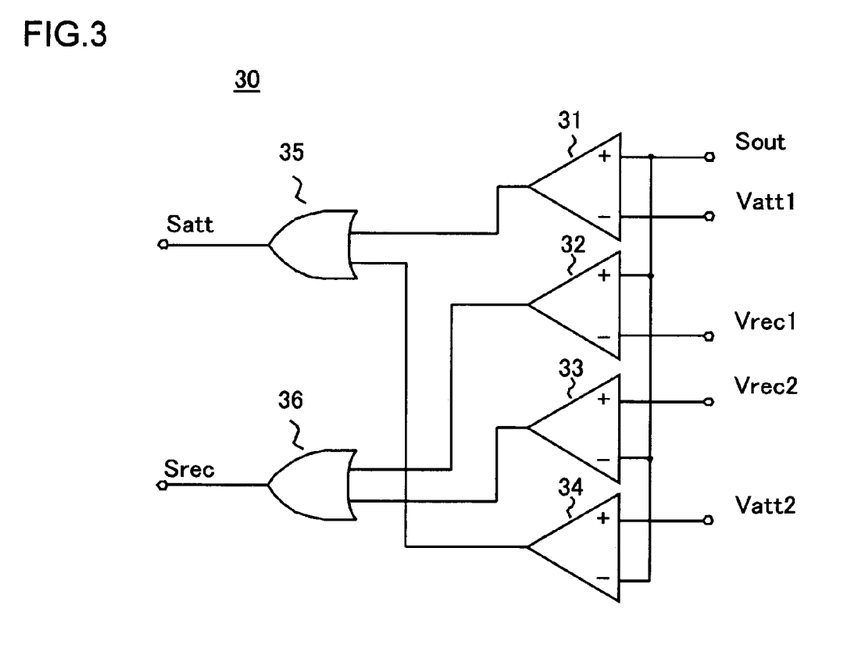
FIG. 3 is a diagram which shows a configuration example of a window comparator shown in FIG. 1.

Description will be made below regarding an amplifier according to an embodiment of the present invention with reference to the drawings. An amplifier according to the present invention includes an ALC function, and is suitably employed in mobile electronic devices having audio input/output functions such as cellular phones and so forth. Such an amplifier provides natural-sounding auditory sensation in both the attack mode and the recovery mode of the ALC while suppressing frequent switching between the attack mode and the recovery mode. Also, the amplifier according to the present invention allows adjustment of the amplification factor and conditions of the attack mode and the recovery mode corresponding to the distance between an electronic device including the amplifier and the user or the listener, thereby providing natural-sounding auditory sensation FIG. 1 is a diagram which shows a configuration of an amplifier according to an embodiment of the present invention. FIG. 2 is a diagram which shows a configuration example of a variable gain amplifier 10 shown in FIG. 1. Also, FIG. 3 is a diagram which shows a configuration example of a window comparator 30 shown in FIG. 1.

Figure 8:
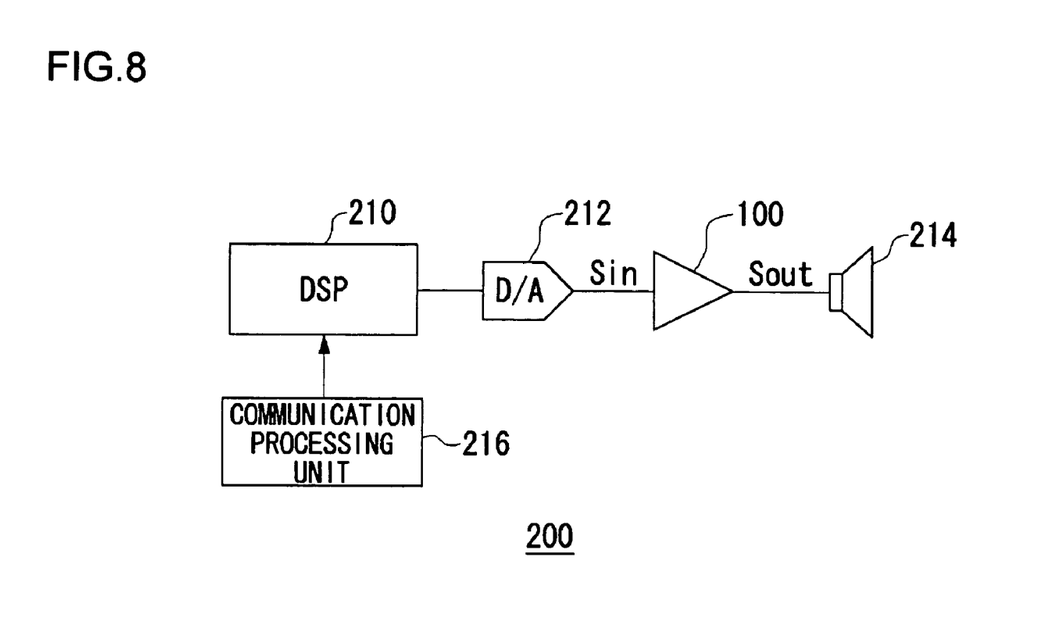
FIG. 8 is a block diagram which shows a configuration of an electronic device including the amplifier.

FIG. 8 is a block diagram which shows a configuration of an electronic device including an amplifier 100. An electronic device 200 shown in FIG. 8 is a cellular phone terminal including audio output means such as a speaker, an earphone, and so forth, for example. The electronic device 200 includes a DSP (Digital Signal Processor) 210, a D/A converter 212, a speaker 214, and a communication processing unit 216. The communication processing unit 216 includes an antenna, amplifier, demodulator, and so forth, and has functions for demodulating communication signals received by the antenna so as to reproduce audio data in the form of digital data. The DSP 210 performs various kinds of signal processing for the digital audio data, and outputs the digital data to the D/A converter 212. The D/A converter 212 converts the digital data into an analog audio signal. The amplifier 100 amplifies the analog audio signal Sin, and outputs the output signal Sout at a predetermined level. The speaker 214 is driven according to the output signal Sout, whereby the user can hear the audio signal.

The amplifier 100 shown in FIG. 1 includes a variable gain amplifier 10, a decoder 20, a window comparator 30, a holding circuit 40, an attack counter 50, a holding circuit 60, a recovery counter 70, an action determining circuit 80, and a setting circuit 90.

The variable gain amplifier 10 amplifies the input signal Sin corresponding to an amplification gain GA so as to output an output signal Sout within a predetermined level. In the present embodiment, description will be made hereafter regarding an arrangement for handling an audio signal. The amplification gain GA is determined based upon a gain control signal Sga supplied from the decoder 20.

FIG. 2 shows a configuration example of the variable gain amplifier 10. As shown in FIG. 2, a series circuit of multiple input resistors 12a through 12d is connected to the inverting input terminal (−) of an operational amplifier 11. Furthermore, switches 13a through 13c, which can be controlled on/off individually, are connected in parallel to the corresponding input resistors 12a through 12c, respectively. Also, another series circuit of multiple feedback resistors 14a through 14d is connected between the inverting input terminal (−) and the output terminal of the operational amplifier 11. Furthermore, switches 15a through 15c, which are on/off controlled individually according to the gain control signal Sga, are connected in parallel to the feedback resistors 14b through 14d, respectively. The non-inverting input terminal (+) of the operational amplifier 11 is connected to a reference voltage level such as the ground level.

The variable gain amplifier 10 is an inverting amplifier having a function of adjustment of the amplification gain GA. With the variable gain amplifier 10, the total input resistance and the total feedback resistance are adjusted in a multi-step manner by actions of the switches controlled according to the gain control signal Sga. This enables analog linear control of the output of the variable gain amplifier 10, thereby realizing improved distortion properties.

Returning to FIG. 1, the window comparator 30 compares the level of the output signal Sout with an attack reference level. Then, a holding circuit 40 outputs an attack signal Satth corresponding to an attack reference comparison result signal Satt obtained as comparison results. Also, the window comparator 30 compares the level of the output signal Sout with a recovery reference level which is different from the attack reference level. Then, a holding circuit 60 outputs a recovery signal Srech corresponding to a recovery reference comparison result signal Srec obtained as comparison results.

In the present specification, the term, "attack" (or attack action), indicates an action of reducing the amplification gain GA. On the other hand, the term, "recovery" (or recovery action), indicates an action of increasing the amplification gain GA.

FIG. 3 shows a configuration example of the window comparator 30. Also, FIG. 4 shows the relation between reference levels used for comparison.

Figure 4:
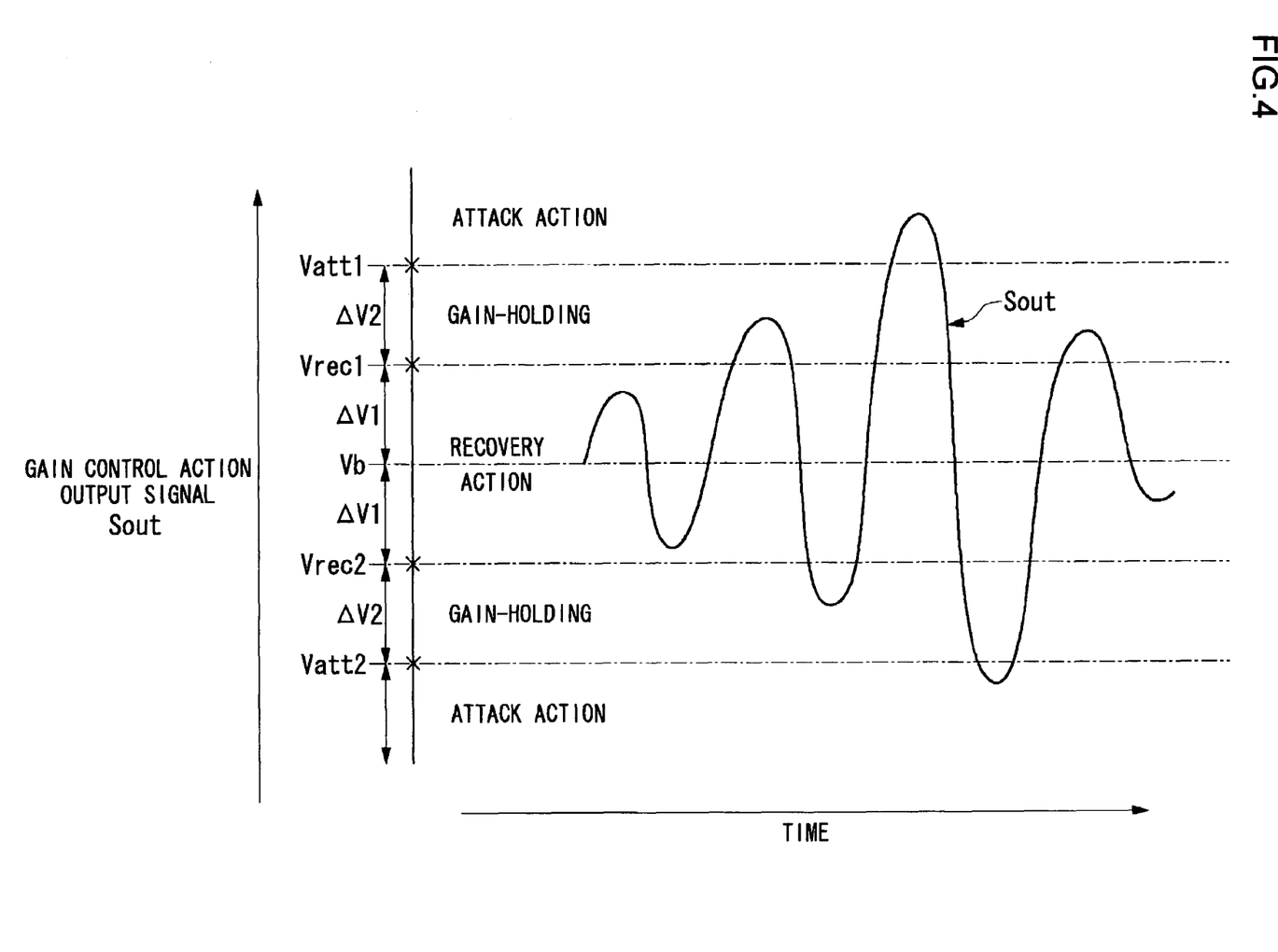
FIG. 4 is a diagram which shows the relation between reference levels used in the window comparator.

In FIG. 4, the output signal center level Vb is the level corresponding to input signal Sin of zero, i.e., the level of the output signal Sout corresponding to the situation of no input audio signals. For generation of the recovery reference comparison result signal Srec, the signal levels determined are: a first recovery reference level Vrec1 which is higher than the output signal center level Vb by a first predetermined voltage $\Delta V1$; and a second recovery reference level Vrec2 which is lower than the output signal center level Vb by the first predetermined voltage $\Delta V1$. Furthermore, for generation of the attack reference comparison result signal Satt, the signal levels determined are: a first attack reference level Vatt1 which is higher than the first recovery reference level Vrec1 by a second predetermined voltage $\Delta V2$; and a second attack reference level Vatt2 which is lower than the second recovery reference level Vrec2 by the second predetermined voltage $\Delta V2$.

Comparators 31 through 34 shown in FIG. 3 compares the level of the output signal Sout with the reference levels Vatt1, Vrec1, Vrec2, and Vatt2, respectively. Note that with the comparators 31 and 32, the output signal Sout is input to the non-inverting input terminals (+) thereof. On the other hand, with the comparators 33 and 34, the output signal Sout is input to the inverting input terminals (−) thereof. The outputs of the comparators 31 and 34 are input to an OR circuit 35, thereby obtaining the attack reference comparison result signal Satt. On the other hand, the outputs of the comparators 32 and 33 are input to an OR circuit 36, thereby obtaining the recovery reference comparison result signal Srec.

With such a configuration, in a case that the output signal level is within a range between: the first recovery reference level Vrec1, which is higher than the output signal center level Vb by the first predetermined voltage $\Delta V1$; and the second recovery level Vrec2, which is lower than the output signal center level Vb by the first predetermined voltage $\Delta V1$, the window comparator 30 outputs the recovery reference comparison result signal Srec which is "L" level.

Furthermore, with the aforementioned configuration, in a case that the output signal level is greater than the first attack reference level Vatt1, which is higher than the first recovery reference level Vrec1 by the second predetermined voltage $\Delta V2$, or is smaller than the second attack reference level Vatt2, which is lower than the second recovery reference level Vrec2 by the second predetermined voltage $\Delta V2$, the window comparator 30 outputs the attack reference comparison result signal Srec which is "H" level.

On the other hand, in a case that the output signal level is within a range between the reference levels Vatt1 and Vrec1, or is within a range between the reference levels Vatt2 and Vrec2, the window comparator 30 outputs neither the recovery reference comparison result signal Srec nor the attack reference comparison result signal Satt.

Note that the reference levels Vatt1, Vrec1, Vrec2, and Vatt2, and the first and second predetermined voltages $\Delta V1$ and $\Delta V2$, can be controlled according to setting values input from external circuits, as necessary.

Also, an arrangement may be made in which the recovery reference comparison result signal Srec and the attack reference comparison result signal Satt are output by actions of the comparators 31 and 32 alone, for handling signals higher than the output signal center level Vb. In this case, the comparators 33 and 34, and the OR circuits 35 and 36, may be omitted.

Returning to FIG. 1 again, description will be made. The attack counter 50 counts an input clock signal CLK so as to output an attack timing signal Ta and an attack reset signal Ra at the same time at a predetermined time interval T1 set beforehand. On the other hand, the recovery counter 70 counts the input clock signal CLK so as to output a recovery timing signal Tr and a recovery reset signal Rr at the same time at a predetermined time interval T2 longer than the predetermined time interval T1 (T1<T2). The present invention is not restricted to an arrangement employing such counters. Rather, an arrangement may be made in which the attack timing signal Ta and the recovery timing signal Tr are generated at the first and second time intervals, respectively, using clocking means other than counters.

The holding circuit 40 holds the peak value of the received attack reference comparison result signal Satt, and outputs the peak value as an attack signal Satth. Note that the holding circuit 40 is reset each time the attack reset signal Ra is received. On the other hand, the holding circuit 60 holds the peak value of the received recovery reference comparison result signal Srec, and outputs the peak value as a recovery signal Srech. Note that the holding circuit 60 is reset each time the recovery reset signal Rr is received.

In a case of output of the attack signal Satth, the action determining circuit 80 generates a gain reduction signal DOWN according to the generated attack timing signal Ta for reducing the amplification gain GA by a first predetermined gain. On the other hand, in a case of output of the recovery signal Srech, the action determining circuit 80 generates a gain increase signal UP according to the generated recovery timing signal Tr for increasing the amplification gain GA by a second predetermined gain.

The first and second predetermined gain are preferably adjusted in increments of a predetermined value of dB (e.g., 1 dB) from the perspective of natural-sounding auditory sensation. These gains can be controlled by adjusting the input resistor 12 and the feedback resistor 14 shown in FIG. 2.

With such an arrangement, the holding circuits 40 and 60 should be reset immediately following determination with regard to the attack signal Satth and the recovery signal Srech by the action determining circuit 80. This allows the user to design the attack counter 50 so as to output the attack timing signals Ta and the attack reset signal Ra with the same timing, or with a certain margin of timing. In the same way, this allows the user to design the recovery counter 70 so as to output the recovery timing signal Tr and the recovery reset signal Rr with the same timing, or with a certain margin of timing.

Here, it is very important to adjust the first predetermined time interval T1 (interval of time at which the attack timing signal Ta is output) used in the attack counter 50, and the second predetermined time interval T2 (interval of time at which the recovery timing signal Tr is output) used in the recovery counter 70, from the perspective of natural-sounding auditory sensation in the attack mode and the recovery mode of an amplifier including an ALC.

The attack action for reducing the amplification gain is preferably performed with a higher frequency than with the recovery action for increasing the amplification gain, from the perspective of natural-sounding auditory sensation. Thus, with an arrangement according to the present invention, the first predetermined time interval T1 used in the attack counter 50 is designed to be shorter than the second predetermined time interval T2 used in the recovery counter 70 (T1<T2).

For example, an arrangement may be made in which the attack action is performed at an rate of approximately 0.8 msec/dB (i.e., the amplification gain is increased by 1 dB per 0.8 msec) and the recovery action is performed at an rate of approximately 8 to 150 msec/dB. In general, the settings preferably employed are such that the attack action is performed at an rate of approximately 0.8 msec/dB, and the recovery action is performed at an rate of approximately 80 msec/dB. That is to say, in this case, the time interval T2 used in the recovery action is set to around 100 times the time interval T1 used in the attack action.

Furthermore, an arrangement according to the present invention allows adjustment of the attack action and the recovery action according to setting values supplied from external circuits. For example, with such an arrangement, the gain-increase rate used in the attack action is preferably adjusted within a range between around 0.05 msec/dB, 0.8 msec/dB, and 6.4 msec/dB. On the other hand, the gain-reduction rate used in the recovery action is preferably adjusted within a range between around 5 msec/dB, 80 msec/dB, and 640 msec/dB, for example.

The decoder 20 receives the gain reduction signal DOWN and the gain increase signal UP from the action determining circuit 80. The decoder 20 changes the gain control signal Sga for each input of these signals, thereby adjusting the amplification gain GA of the variable gain amplifier 10. Note that the decoder 20 has a function of adjustment of the maximum value and the minimum value of the gain control signal Sga according to setting values supplied from external circuits.

The setting circuit 90 rewritably stores: the maximum value and maximum value of the gain control signal Sga output from the decoder 20; the first predetermined time interval T1 used in the attack counter 50; the second predetermined time interval T2 used in the recovery counter 70; and the setting values for setting each reference level used in the window comparator 30, in a built-in resistor according to setting values supplied from external circuits.

Such an arrangement allows individual adjustment of the first predetermined time interval T1 and the second predetermined time interval T2 at a desirable time according to the setting values stored in the setting circuit 90. This enables dynamic adjustment of audio signals from the perspective of natural-sounding auditory sensation regardless of whether or not the amplifier 100 actually performs amplification. Furthermore, the aforementioned arrangement allows dynamic adjustment of the maximum value and the minimum value of the gain control signal Sga at a desirable time based upon the actual state of use such as the distance between the user and the speaker 214 of the electronic device 200 including the amplifier 100, and so forth.

Description will be made regarding the operation of the amplifier having such a configuration described above with reference to an operation state diagram shown in FIG. 5, an operation timing chart shown in FIG. 6, and a state transition diagram for the amplifier 100 shown in FIG. 7.

Figure 5:
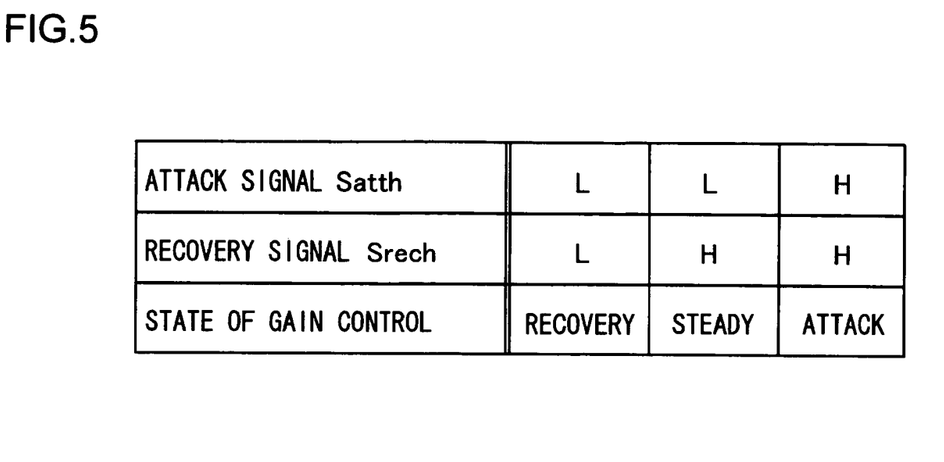
FIG. 5 is a diagram which shows each state of the gain control mechanism.
Figure 6A:
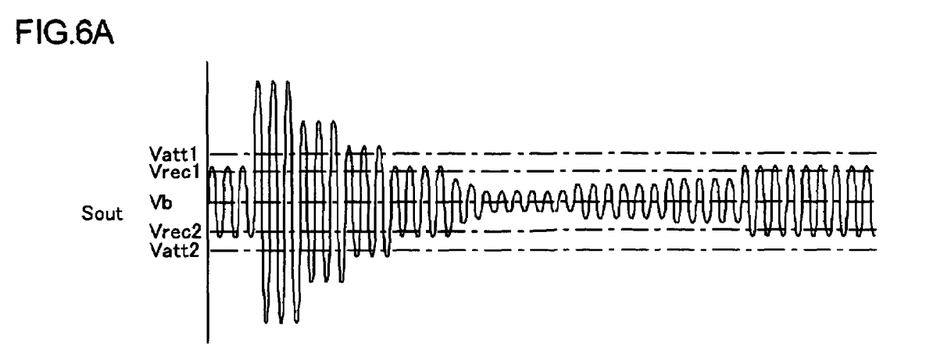
FIGS. 6A to 6H are operation timing charts of the amplifier shown in FIG. 1.
Figure 6B:
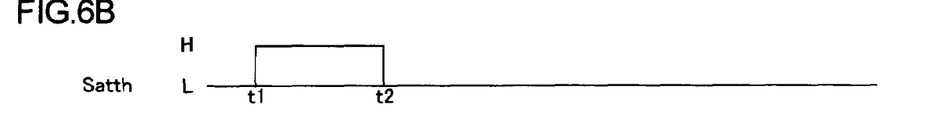

As shown in FIG. 5, in a case of the attack signal Satth of "H" level, the gain control mechanism is in the "attack" state. In a case of the recovery signal Srech of "L" level, the gain control mechanism is in the "recovery" state. On the other hand, in a case of the attack signal Satth of "L" level, and the recovery signal Srech of "H" level, the gain control mechanism is in the "steady" state. FIG. 7 shows a steady state S10, an attack state S12, and a recovery state S13, corresponding to the aforementioned states.

Description will be made with reference to the timing chart shown in FIGS. 6(a) through 6(h). FIG. 6(a) shows the output signal Sout, FIG. 6(b) shows the attack sgnal Satth, FIG. 6(c) shows the attack timing signal Ta and the attack reset signal Ra, FIG. 6(d) shows the gain reduction signal DOWN, FIG. 6(e) shows the recovery signal Srech, FIG. 6(f) shows the recovery timing signal Tr and the recovery reset signal Rr, FIG. 6(g) shows the gain increase signal UP, and FIG. 6(h) shows transition of the gain control state.

Figure 6C:
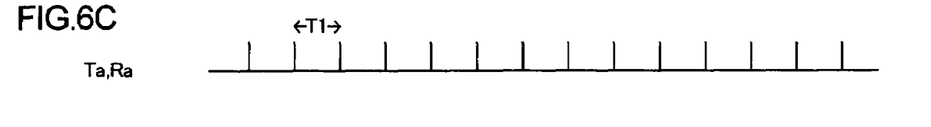
Figure 6D:
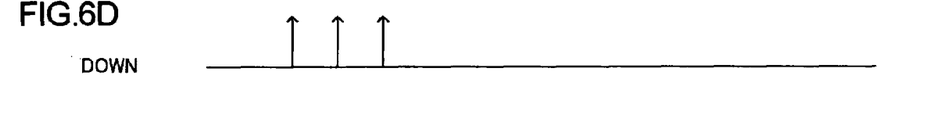
Figure 6E:
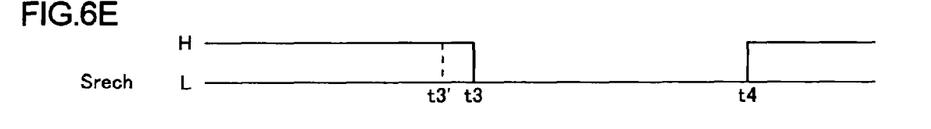
Figure 6F:
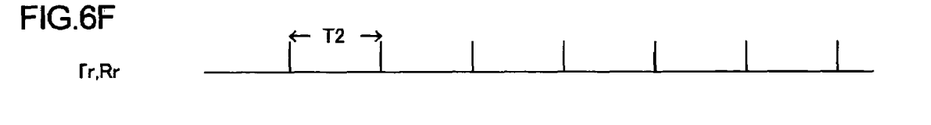
Figure 6G:
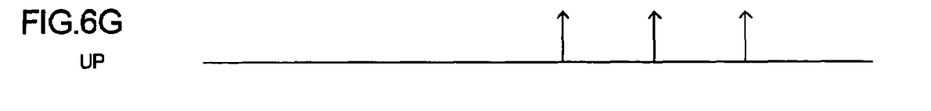
Figure 6H:
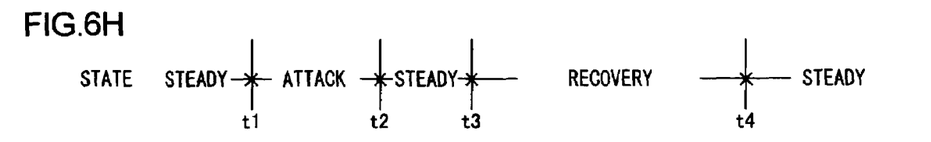
Figure 7:
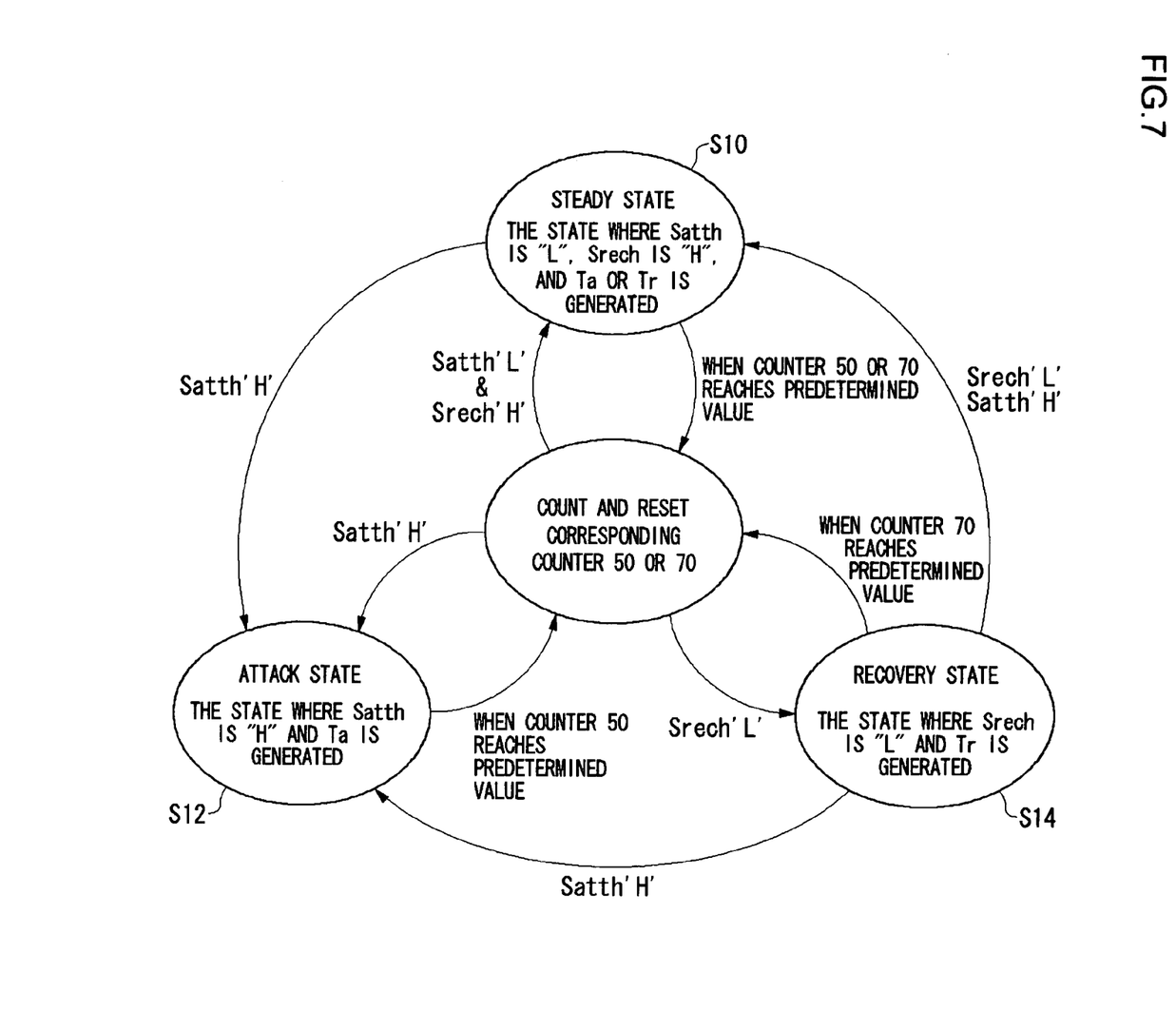
FIG. 7 is a diagram which shows state transition of the amplifier shown in FIG. 1.

As shown in FIGS. 6(c) and 6(f), the attack counter 50 generates the attack timing signal Ta and the attack reset signal Ra at the first predetermined time interval T1, and the recovery counter 70 generates the recovery timing signal Tr and the recovery reset signal Rr at the second predetermined time interval T2.

Before the point in time t1, the attack signal Satth is "L" level and the recovery signal Srech is "H" level, and accordingly, the gain control mechanism is in the "steady" state. That is to say, even in the event of generation of the attack timing signal Ta or the attack reset signal Tr, the "steady" state is maintained until the point in time t1.

Subsequently, at the point in time t1, the attack signal Satth goes to "H" level. Accordingly, transition is made from the "steady" state to the "attack" state. Following the transition to the "attack" state, in a case of generation of the attack timing signal Ta, the attack action is performed so as to decrement the amplification gain GA. That is to say, the amplification gain GA is decremented each time the attack timing signal Ta is generated during the "attack" state.

Subsequently, at the point in time t2, the attack signal Satth goes to "L" level with the recovery signal Srech kept at "H" level, and accordingly, the gain control mechanism enters the "steady" state again. Note that at the point in time t3', the level of the output signal Sout enters the region where the recovery action should be performed from the perspective of the output signal level. However, the gain control mechanism is kept in the "steady" state until the point in time t3 since the recovery signal Srech is kept at "H" level.

Subsequently, at the point in time t3, the recovery signal Srech goes to "L" level. Accordingly, with the gain control mechanism, transition is made from the "steady" state to the "recovery" state. Following transition to the "recovery" state, in a case of generation of the recovery timing signal Tr, the recovery action is performed so as to increase the amplification gain GA by an increment. That is to say, the amplification gain GA is incremented each time the recovery timing signal Tr is generated during the "recovery" state.

Subsequently, at the point in time t4, the recovery signal Srech goes to "H" level while keeping the attack signal Satth at "L" level. Accordingly, the gain control mechanism enters the "steady" state, again.

As described above, the amplifier 100 according to the present embodiment includes the window comparator 30, thereby allowing the gain control mechanism to enter the state where neither the attack action for reducing the amplification gain GA nor the recovery action for increasing the amplification gain GA is not performed, i.e., the state where the gain is maintained. This suppresses frequent change in the amplification gain, thereby suppressing unnatural-sounding audio signals from the perspective of auditory sensation.

Furthermore, with the amplifier 100 according to the present embodiment, the recovery timing signal Tr is generated at the second time interval T2 which is longer than the first time interval T1 at which the attack timing signal Ta is generated. Accordingly, the attack action for reducing the amplification gain GA is performed with a higher frequency than with the recovery action for increasing the amplification gain. This enables output of natural-sounding audio signals from the perspective of auditory sensation in both the attack mode and the recovery mode.

Now, let us consider a situation which is not shown in FIG. 6, where the level of the output signal Sout rapidly rises to a considerable level. In this case, the transition is made from the "recovery" state to the "attack" state, from the "steady" state to the "attack" state, or from the "recovery" state to the "steady" state, immediately upon generation of the attack timing signal Ta and the recovery timing signal Tr. On the other hand, let us consider another situation where the level of the output signal Sout rapidly drops considerably. In this case, the recovery reference comparison result signal Srec is held until the next recovery reset signal Rr as described with reference to an example at the point in time t3' in FIG. 6. In the same way, the attack reference comparison result signal Satt is held until the next attack reset signal Ra. That is to say, in this case, upon generation of the next reset signal (recovery reset signal Rr, attack reset signal Ra, or both thereof), transition is made to the "recovery" state.

As described above, with the amplifier 100 according to the present embodiment, different processing is performed between: a situation where the output signal Sout rapidly rises to a considerable level; and a situation where the output signal Sout rapidly drops considerably. That is to say, the attack action is performed immediately while performing the recovery action with a certain delay as compared with the attack action, thereby improving audio quality from the perspective of auditory sensation.

The above-described embodiments have been described for exemplary purposes only, and are by no means intended to be interpreted restrictively. Rather, it can be readily conceived by those skilled in this art that various modifications may be made by making various combinations of the aforementioned components or the aforementioned processing, which are also encompassed in the technical scope of the present invention.

While description has been made in the aforementioned embodiment regarding an arrangement in which a cellular phone terminal is employed as the electronic device 200, the present invention is not restricted to the aforementioned arrangement. Rather, examples of employed as the electronic device 200 include CD players, MD players, and other types of silicon audio players, having functions for reading out and reproducing digital data recorded on a disk or the like.

What is claimed is:

1. An amplifier circuit including a variable gain amplifier having a function of adjustment of an amplification gain according to a gain control signal for amplifying an input signal with the gain thus adjusted, thereby outputting an output signal within a predetermined level, said amplifier circuit comprising:

a window comparator which compares a level of said output signal (which will be referred to as "output signal level" hereafter) with an attack reference level, and outputs an attack signal based upon an attack reference comparison result signal thus obtained, and which compares said output signal level with a recovery reference level different from said attack reference level, and outputs a recovery signal based upon a recovery reference comparison result signal thus obtained;

an attack timing signal generating unit for outputting an attack timing signal at first predetermined time intervals;

a recovery timing signal generating unit for outputting a recovery timing signal at second time intervals which are longer than said first predetermined time interval; and an action determining circuit which generates a gain reduction signal for decrementing said amplification gain by a first predetermined gain each time said attack timing signal is generated during output of said attack signal, and generating a gain increase signal for incrementing said amplification gain by a second predetermined gain each time said recovery timing signal is generated during output of said recovery signal, wherein the amplification gain of said variable gain amplifier is reduced or increased based upon said gain reduction signal or said gain increase signal while maintaining said amplification gain in a case that neither said gain reduction signal nor said gain increase signal is output.

2. An amplifier circuit according to claim 1, wherein said attack reference comparison result signal is held, and the signal thus held is used as said attack signal, and wherein said attack signal is reset according to an attack reset signal output at the same time as with said attack timing signal, and wherein said recovery reference comparison result signal is held, and the signal thus held is used as said recovery signal, and wherein said recovery signal is reset according to a recovery reset signal output at the same time as with said recovery timing signal.

3. An amplifier circuit according to claim 2, wherein in the event that said output signal level is within a range between: a first recovery reference level which is higher than an output signal center level by a first predetermined voltage; and a second recovery reference level which is lower than said output signal center level by said first predetermined voltage, said recovery reference comparison result signal is output, and wherein in the event that said output signal level is greater than a first attack reference level which is higher than said first recovery reference level by a second predetermined voltage, or is smaller than a second attack reference level which is lower than said second recovery reference level by said second predetermined voltage, said attack reference comparison result signal is output.

4. An amplifier circuit according to claim 1, having functions of adjustment of each of: said first predetermined time interval used in said attack timing generating unit; and said second predetermined time interval used in said recovery timing signal generating unit, according to setting values supplied from external circuits.

5. An amplifier circuit according to claim 2, having functions of adjustment of each of: said first predetermined time interval used in said attack timing generating unit; and said second predetermined time interval used in said recovery timing signal generating unit, according to setting values supplied from external circuits.

6. An amplifier circuit according to claim 3, having functions of adjustment of each of: said first predetermined time interval used in said attack timing generating unit; and said second predetermined time interval used in said recovery timing signal generating unit, according to setting values supplied from external circuits.

7. An amplifier circuit according to claim 4, further including a setting circuit for rewritably storing setting values which are supplied from external circuits and used as said first predetermined time interval and said second predetermined time interval, wherein said first predetermined time interval and said second predetermined time interval are set in said attack timing signal generating unit and said recovery timing signal generating unit, respectively, based upon said setting values stored in said setting circuit.

8. An amplifier circuit according to claim 5, further including a setting circuit for rewritably storing setting values which are supplied from external circuits and used as said first predetermined time interval and said second predetermined time interval, wherein said first predetermined time interval and said second predetermined time interval are set in said attack timing signal generating unit and said recovery timing signal generating unit, respectively, based upon said setting values stored in said setting circuit.

9. An amplifier circuit according to claim 6, further including a setting circuit for rewritably storing setting values which are supplied from external circuits and used as said first predetermined time interval and said second predetermined time interval, wherein said first predetermined time interval and said second predetermined time interval are set in said attack timing signal generating unit and said recovery timing signal generating unit, respectively, based upon said setting values stored in said setting circuit.

10. An amplifier circuit according to claim 1, wherein said attack timing signal generating unit and said recovery timing signal generating unit are counter circuits for counting a clock signal supplied from external circuits, thereby counting said first and second predetermined time intervals.

11. An amplifier circuit according to claim 1, wherein said variable gain amplifier is of a switched-resistor amplifier type having a function of adjustment of the gain by switching resistance of a resistor included therein,
and wherein gain control is performed by switching said resistance between multiple values by actions of a set of switches.

12. An amplifier circuit according to claim 2, wherein said variable gain amplifier is of a switched-resistor amplifier type having a function of adjustment of the gain by switching resistance of a resistor included therein,
and wherein gain control is performed by switching said resistance between multiple values by actions of a set of switches.

13. An amplifier circuit according to claim 3, wherein said variable gain amplifier is of a switched-resistor amplifier type having a function of adjustment of the gain by switching resistance of a resistor included therein,
and wherein gain control is performed by switching said resistance between multiple values by actions of a set of switches.

14. An amplifier circuit according to claim 11, further including a decoder which generates said gain control signal based upon said gain reduction signal and said gain increase signal, and which supplies said gain control signal to said variable gain amplifier,
wherein a maximum value and a minimum value of said gain control signal output from said decoder are adjustably set based upon setting values supplied from external circuits.

15. An amplifier circuit according to claim 12, further including a decoder which generates said gain control signal based upon said gain reduction signal and said gain increase signal, and which supplies said gain control signal to said variable gain amplifier,
wherein a maximum value and a minimum value of said gain control signal output from said decoder are adjustably set based upon setting values supplied from external circuits.

16. An amplifier circuit according to claim 13, further including a decoder which generates said gain control signal based upon said gain reduction signal and said gain increase signal, and which supplies said gain control signal to said variable gain amplifier,
wherein a maximum value and a minimum value of said gain control signal output from said decoder are adjustably set based upon setting values supplied from external circuits.

17. An amplifier circuit according to claim 14, further including a setting circuit for rewritably storing setting values which are supplied from external circuits, and used as said maximum value and said minimum value of said gain control signal,
wherein said maximum value and said minimum value of said gain control signal are set in said decoder based upon said setting values stored in said setting circuit.

18. An amplifier circuit according to claim 15, further including a setting circuit for rewritably storing setting values which are supplied from external circuits, and used as said maximum value and said minimum value of said gain control signal,
wherein said maximum value and said minimum value of said gain control signal are set in said decoder based upon said setting values stored in said setting circuit.

19. An amplifier circuit according to claim 16, further including a setting circuit for rewritably storing setting values which are supplied from external circuits, and used as said maximum value and said minimum value of said gain control signal,
wherein said maximum value and said minimum value of said gain control signal are set in said decoder based upon said setting values stored in said setting circuit.

20. An electronic device comprising:
an audio output unit; and
an amplifier circuit according to claim 1 which output an analog audio signal to said audio output unit.

* * * * *